United States Patent [19]

Steadman

[11] Patent Number: 6,058,052
[45] Date of Patent: *May 2, 2000

[54] REDUNDANCY SCHEME PROVIDING IMPROVEMENTS IN REDUNDANT CIRCUIT ACCESS TIME AND INTEGRATED CIRCUIT LAYOUT AREA

[75] Inventor: Martin Steadman, London, United Kingdom

[73] Assignee: Cypress Semiconductor Corp., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/915,984

[22] Filed: Aug. 21, 1997

[51] Int. Cl.$^7$ ...................................................... G11C 7/00
[52] U.S. Cl. ........................... 365/200; 365/203; 365/205
[58] Field of Search ................................... 365/200, 205, 365/203

[56] References Cited

U.S. PATENT DOCUMENTS

| | | | |
|---|---|---|---|
| 4,462,091 | 7/1984 | Kneeper et al. | 365/200 |
| 4,532,611 | 7/1985 | Countryman, Jr. | 365/200 |
| 4,581,739 | 4/1986 | McMahon, Jr. | 371/21 |
| 4,601,019 | 7/1986 | Shah et al. | 365/200 |
| 4,807,191 | 2/1989 | Flannagan | 365/189 |
| 4,811,298 | 3/1989 | Helwig et al. | 365/200 |
| 4,819,205 | 4/1989 | McRoberts | 365/1 |
| 5,022,006 | 6/1991 | Fifield et al. | 365/200 |
| 5,134,616 | 7/1992 | Barth, Jr. et al. | 371/10.3 |
| 5,262,994 | 11/1993 | McClure | 365/200 |
| 5,268,866 | 12/1993 | Feng et al. | 365/200 |
| 5,359,563 | 10/1994 | Bredin et al. | 365/200 |
| 5,491,664 | 2/1996 | Phelan | 365/200 |
| 5,497,347 | 3/1996 | Feng | 365/189.07 |
| 5,502,676 | 3/1996 | Pelley, III et al. | 365/200 |

FOREIGN PATENT DOCUMENTS

| | | |
|---|---|---|
| 335125 | 2/1989 | European Pat. Off. . |
| 336101 | 2/1989 | European Pat. Off. . |
| 335149 | 9/1989 | European Pat. Off. . |
| 559368 | 2/1993 | European Pat. Off. . |

OTHER PUBLICATIONS

32K×32 Synchronous–Pipedlined Cache Ram CY7C1335, Oct. 1996, pp. 1–16.

*Primary Examiner*—David Nelms
*Assistant Examiner*—Hoai V. Ho
*Attorney, Agent, or Firm*—Christopher P. Maiorana, P.C.

[57] ABSTRACT

A circuit comprising a main memory array with a block of columns per data I/O, a main read/write block per block of columns, one or more spare memory columns, a bad address detector circuit per spare column, and a read/write block per spare column. A spare column may replace a defective column or cell in any of the blocks of columns. The spare column may be read from/written to via the main read/write block of the column it is replacing, or via its own dedicated read/write block to improve access times. The bad address detector can be configured with programmable elements to produce a control signal when the address of a defective memory element (cell or column) is applied. This signal is then used to disable the defective memory element (and read/write block) and enable a spare column (and read/write block) in its place. The present invention also comprises a recovery circuit on the local data lines (multiplexed to the addressed bitlines). The recovery circuit in the block with the defective column is activated during a spare access. This allows the memory to be tolerant of some of the faults normally combated with column disconnect fuses without the use of such fuses. The present invention also comprises a logic circuit that utilizes a signal synchronized to the address signals to improve the speed of operation of the redundancy scheme.

10 Claims, 8 Drawing Sheets

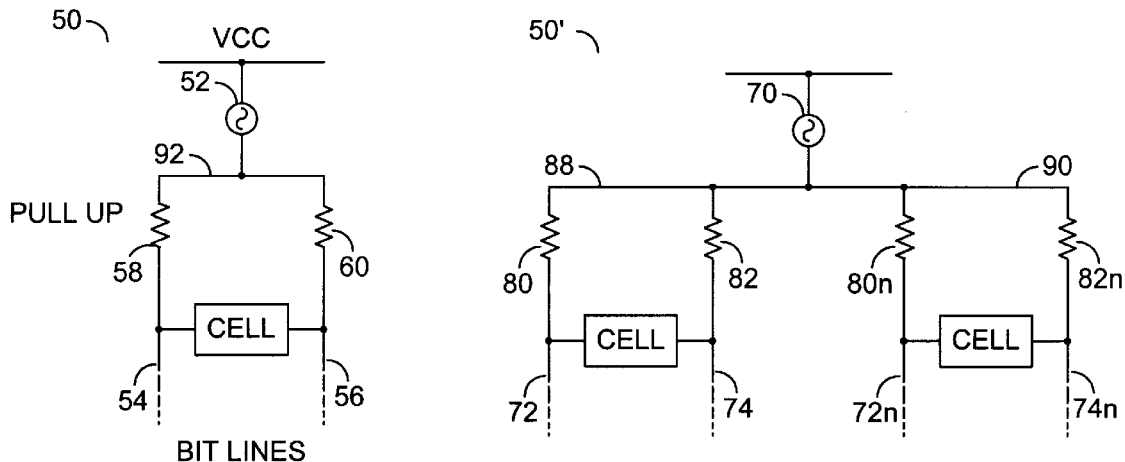
FIG. 3A
(PRIOR ART)
FIG. 3B
(PRIOR ART)
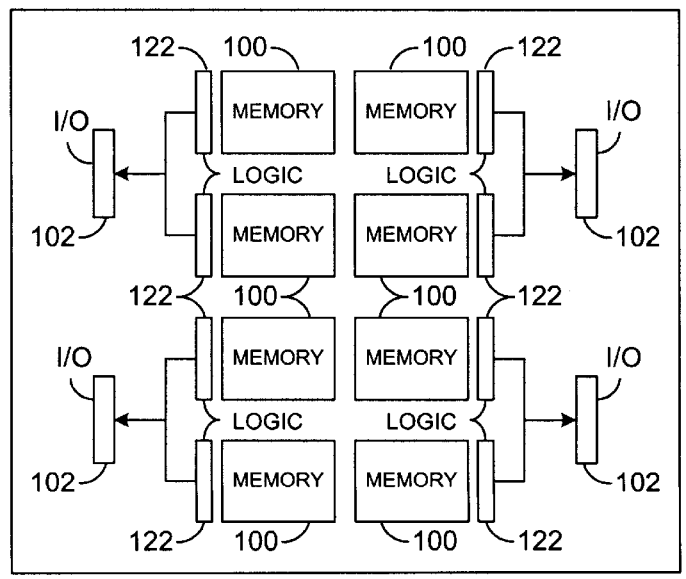
FIG. 5

REDUNDANCY SCHEME PROVIDING IMPROVEMENTS IN REDUNDANT CIRCUIT ACCESS TIME AND INTEGRATED CIRCUIT LAYOUT AREA

FIELD OF THE INVENTION

The present invention relates to memory arrays generally and, more particularly, to a circuit and method for providing improvements in redundant circuit access time and integrated circuit layout area.

BACKGROUND OF THE INVENTION

Memory arrays can use redundant memory elements (i.e., cells and accompanying wordlines and bitlines organized as rows or columns) to compensate for production errors. Specifically, after the production of a complete memory array, a post production test in the memory array is generally performed. The post-production testing may indicate that a particular column, row or cell of the memory array is defective. A redundant memory element can then be substituted for the defective element(s). This substitution typically occurs after the entire memory array has been manufactured. By allowing a defective memory element to be replaced by a redundant element after production, the memory array can still be used.

One conventional approach to repair column failures in a memory array typically required a fuse for each column to be disabled. FIG. 1 illustrates a circuit 10 for disabling a defective column using a fuse. The circuit 10 generally comprises an address decoder 12, a fuse 14 and a pass gate 16 for each of the columns in the memory array. Each address decoder 12 generally has a fuse 14 at its output. When the fuse 14 is blown, the pass gate 16 is permanently disconnected from the decoder 12. A small pull-down, or pull-up leaker path 18 generally ensures that the pass gate 16 stays shut. The pass gate 16 has inputs 24 and 26 received from the bitlines of the memory column and an output 20 and an output 22 (e.g., local data lines or tbus) that are connected to additional pass gates, a sense amplifier and a write driver. Since each column of the array in this approach may require a fuse 14 to be disconnected, the impact on die area is large. A spare column can be multiplexed into the normal sense amplifier or a combined spare column and sense amplifier may be implemented to replace the faulty column previously disabled.

Often an entire block of columns is replaced even though only a single column exhibits a fault. This generally occurs when a single fuse is used to disable a block of cells which contains two or more columns. While disabling columns in blocks requires less fuses than the first method, the technique is an inefficient use of die area since several spare columns may ultimately be used to repair a single bad column. Additionally, there may be no means to replace a spare block if one of the columns in the spare block also contains a fault.

FIG. 2 illustrates a circuit 30 implementing a block approach to replacing a defective column. Each I/O cell 32 has an associated read/write circuit 34 and a block of main memory 38. One or more spare memory and read/write circuits 36 and memory blocks 40 are provided such that they can be connected to an I/O cell to replace one of the main blocks, should the main block be faulty.

Static random access memories (SRAMs) tend to have memory cell data levels near a supply rail voltage. The bitlines may have pull-up or pull-down devices to help clamp the lines at the supply voltage such that, for example, a logic high is indicated by VCC and a logic low by (VCC−100 mV). The bitlines are often fabricated on the same interconnect layer as the memory core power supply routing. If a bitline is shorted to the opposite supply due to a manufacturing defect, the chip current (ICC) may increase to an undesirable level. It may also no longer be possible to read or write arbitrary data to any memory cell on that column as one bitline will be permanently held by the short despite the efforts of the cell (read) or write driver (write). One of the columns in the memory block is accessed via a bi-directional multiplexer built from column pass gates under control of a column address. The individual column bitline pairs are multiplexed to a common local data line or bus pair which is in turn connected to the block sense amplifier and write driver. A further functional failure may also result due to the shorted bitline charging/discharging the local data line. If the charging/discharging is too great, the subsequent access of a good column may be affected as the data line and hence bitline is no longer initially at a near-supply level. In the worst case, failure to precharge the local data line may result in the memory cell drive current being overcome by the charge on the local data line, thereby undesirably changing the logic state of the cell.

To prevent the extra ICC and/or functional failure, bitlines are often provided with additional fuses to disconnect them from the supply to which they are normally clamped. FIG. 3 shows a typical example of a circuit 50 implementing such a bitline disconnect. The circuit 50 comprises a fuse 52, a column of memory cells connected to complementary bitlines 54 and 56 and bitline pull-ups 58 and 60. Blowing the fuse 52 removes the possibility of a path between VCC and GND via the bitlines. For a block replacement redundancy scheme the circuit 50' is often used to reduce the number of fuses. Here, all the bitlines 72, 74, 72n 74n in the n columns have their pull-ups 80, 82, 80n, 82n commonly connected to the supply by a single fuse 70. The fuse 70 can therefore disable the whole block. Either arrangement consumes die area for the fuses.

In general, it is desirable to maintain a balance between providing sufficient quantity of spare elements as well as flexibility in the implementation of the spare memory elements. Desirable design criteria often include both the ability to repair faulty elements while minimizing the overall die area. In modern memory technologies, (e.g., 0.5 µm gate width or less), the fuse center to fuse center pitch is typically similar or greater than the pitch of a memory column. Thus, the layout of a circuit with a fuse per column typically results in two or more rows of fuses, greatly impacting die area consumed. Circuitry pitched to the memory columns (or rows) is very expensive in terms of die area, compared to circuits in the chip periphery that can be laid out in an arbitrary manner. Therefore, one of ordinary skill in the art also desires to minimize the number of fuses. Additionally, one also wants to keep the overall cost of producing the chip to a minimum.

SUMMARY OF THE INVENTION

The present invention concerns a circuit comprising a main memory array with a block of columns per data I/O, a main read/write block per block of columns, one or more spare memory columns, a bad address detector circuit per spare column, and optionally a read/write block per spare column. A spare column may replace a defective column or cell in any of the blocks of columns. The spare column may be read from/written to via the main read/write block of the column it is replacing, or via its own dedicated read/write block which will generally improve access times. The bad address detector can be configured with programmable elements to produce a control signal when the address of a defective memory element (cell or column) is applied. This signal is then used to disable the defective memory element (and read/write block) and enable a spare column (and read/write block) in its place.

The present invention also comprises a recovery circuit on the local data lines (multiplexed to the addressed bitlines). The recovery circuit in the block with the defective column is activated during a spare access. This allows the memory to be tolerant of some of the faults normally combated with column disconnect fuses without the use of such fuses.

The present invention also comprises a logic circuit that utilizes a signal synchronized to the address signals to improve the speed of operation of the redundancy scheme.

The objects, features and advantages of the present invention include a circuit and method for providing improvements in redundant circuit access time and integrated circuit layout area.

BRIEF DESCRIPTION OF THE DRAWINGS

These and other objects, features and advantages of the present invention will be apparent from the following detailed description and the appended claims and drawings in which:

FIGS. 3A and 3B illustrate conventional approaches where fuses may disconnect defective columns from a power supply;

FIG. 5 is a block diagram illustrating an implementation of a memory array incorporating the present invention;

DETAILED DESCRIPTION OF THE PREFERRED EMBODIMENTS

Figure 1:
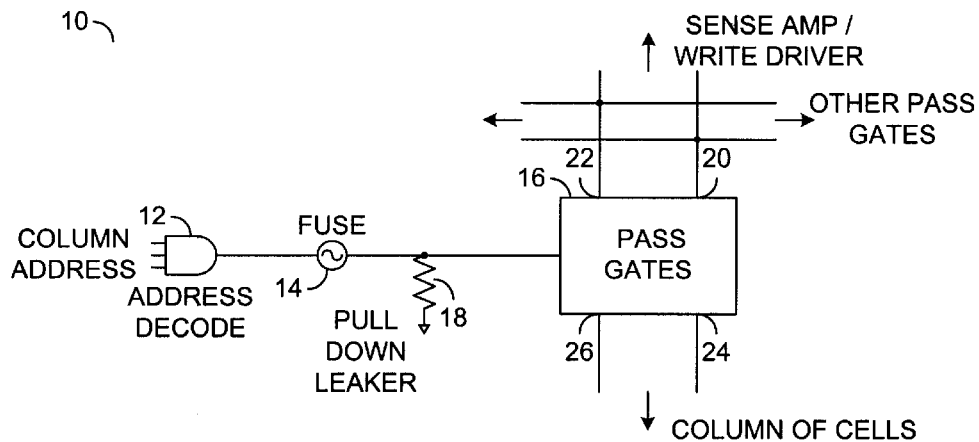
FIG. 1 is a block diagram of a conventional circuit for disabling a defective column using a fuse.
Figure 2:
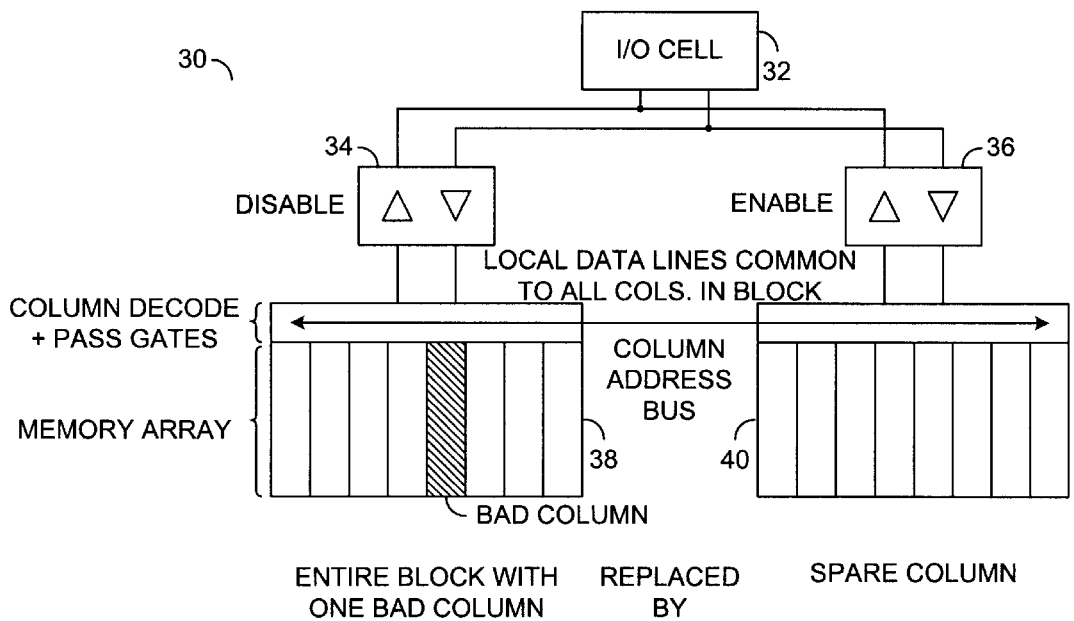
FIG. 2 is a block diagram illustrating a block substitution scheme.
Figure 4:
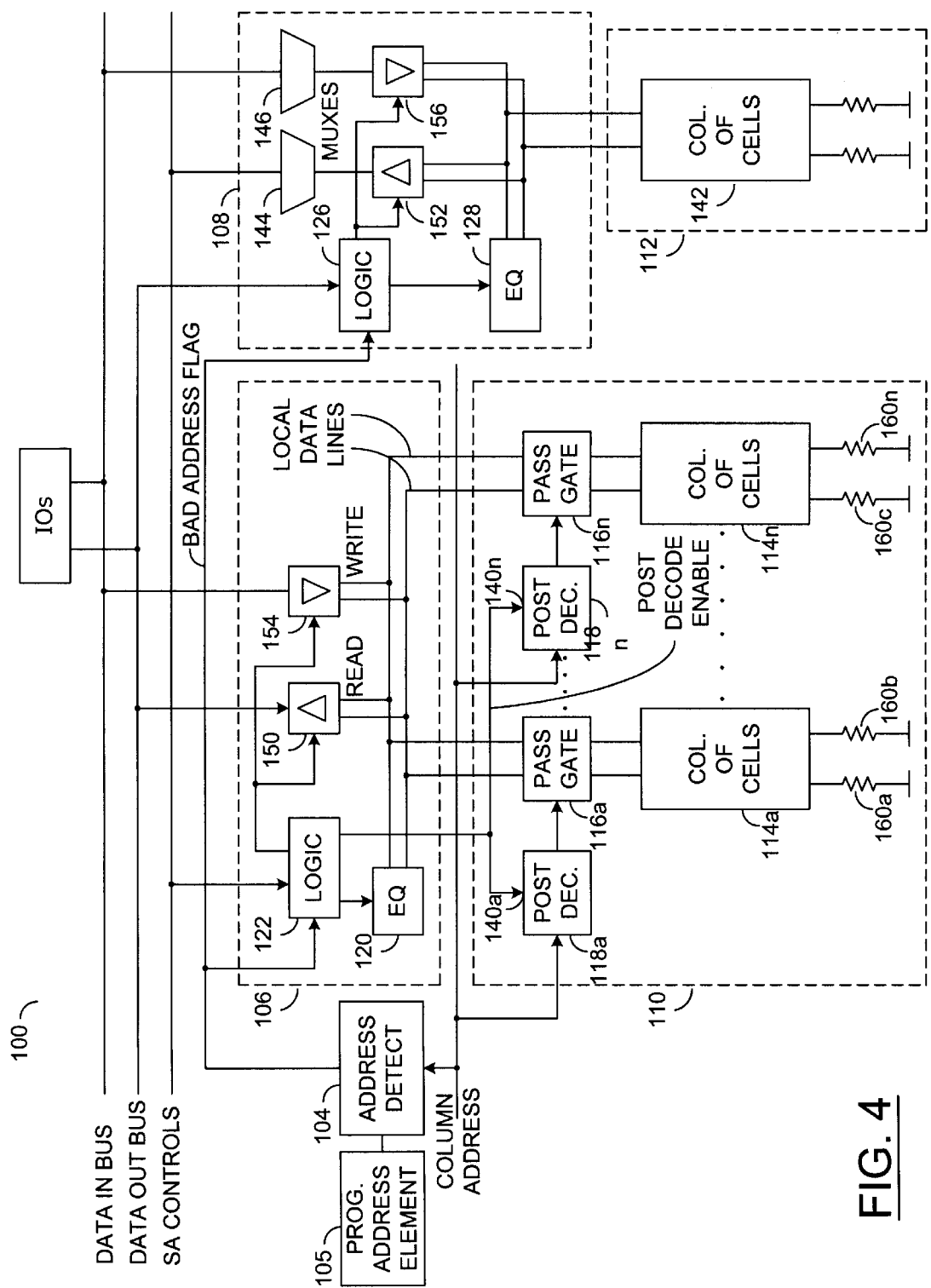
FIG. 4 is a block diagram of a preferred embodiment of the present invention.

Referring to FIG. 4, a block diagram of a memory circuit 100 is shown in accordance with a preferred embodiment of the present invention. The memory circuit 100 generally comprises, a block of one or more I/O cells (102), a block of n memory columns, column pass gates and address postdecoders (110) per I/O cell, a number of bitline loads (160a–160n) such that the bitlines and local data lines normally operate near a supply rail (e.g., VCC), a main read/write block (106) per memory block containing a sense amplifier (150), a write driver (154), a local data line recovery (e.g., eq) circuit (120), a logic circuit (122), one or more spare memory columns (112), a defective address detection block (104) per spare column, a spare read/write block (108) per spare column containing a sense amplifier (152), a write driver (156), a local data line recovery (e.g., eq) circuit (128), a logic circuit (126) the logic function of which may differ from that of the main block(s), and input and output multiplexers (144 and 146) per spare read/write block.

The postdecoder 118a–118n for each main column 114a–114n controls the pass gates on the bitlines and hence the passage of data to/from the column. The postdecoders 118a–118n and column pass gates 116a–116n are connected so that read and write blocks 150 and 154 and pair of local data (or bus) lines are multiplexed between the n columns of the memory block. The address inputs of the postdecoders 118a–118n are connected to the address bus such that only one output of the n columns is selected (e.g., connected to the local data lines) at a time (i.e., each I/O's memory block will have one column selected). The postdecoders may be disabled by deasserting the enable line to their inputs 140a–140n, such that no bitlines are connected to the local data lines. No fuse disable of the postdecoders is required.

Each address detector 104 may be configured with programmable elements 105 to react to the address of a memory column that is completely defective or that contains one or more defective cells. The address detector sends out a "bad address flag" that disables the defective memory column using the postdecoder enable input and activates the spare column 142 associated with the address detector. In this embodiment each spare column 142 has corresponding read/write blocks 152 and 156. This avoids any problems of routing and/or delays that may be encountered if the spare bit lines are coupled into the main read/write block via a multiplexer. The spare read and write blocks 152 and 156 should however be multiplexed (i.e., by multiplexers 144 and 146) onto the global I/O lines corresponding to the replaced read/write and memory blocks. This lessens routing and/or delay problems as the data on the global bus can be easily and quickly driven to large logic swings, compared to the relatively weak memory cell drive typically available on the local data lines.

The bitline loads 160a–160n may not include disconnect fuses in order to save die area. To provide functional immunity from bitlines shorted, in this case, to ground, a recovery or equalization circuit 120 is used to restore the main local data lines to their precharged level during a column replacement. The sequence of events is: the column address connects the defective column to the local data lines, possibly discharging one or both significantly; the address detector indicates a defective column; the column postdecoders and the read/write in the main block with the defective element are disabled; a spare column and read/write block are enabled; the now isolated local data lines are restored to their proper level by the action of the recovery circuit. The recovery circuit may conveniently be that generally used for recovery after a normal write operation, hence the spare column also has a recovery circuit 128 which is only used after a write. The write process usually involves the write driver pulling one local data line and the corresponding addressed bit line to near ground (for the case of bitlines with pull-ups) a similar situation to a faulty bitline shorted to ground. The read recovery circuit is usually only large enough to allow recovery from the small bitline excursion provided by the memory cell, typically 100 mV in a system designed to operate at a supply voltage of 3 volts, while the write bitline differential is greater than 1 V) and so an independent write recovery circuit is advantageous. Hence, the memory circuit will still function with a bitline shorted to ground, without the use of bitline load disconnect fuses, saving valuable die area. However, any excess ICC is not removed in this configuration. The recovery circuits 120 and 128 will be described in more detail in connection with FIG. 10.

The logic for the read/write blocks 122, 126 generally gates the normal read/write controls (e.g., sense amp enable, write pulse) with the bad address flag to enable and disable the block as appropriate. The logic 122 in each main block also produces the postdecoder enable signal. The main read/write block logic 122 may be programmable in order that only the block containing the defective memory clement responds to the bad address flag. There may be more than one bad address flag, i.e., multiple spare columns, and so each main read/write block may be capable of reacting to one or more of the flags. Each spare column responds only to its own bad address detector and so logic 126 is simpler than logic 122. For example, if a particular column, e.g., column 17, of a particular memory block, e.g., that for I/O 3, is defective, the bad address detector providing the redundancy control signal for the first spare memory element e.g., RCOL<0> may be programmed to respond to column address 17. The logic for read/write block 3 should then be programmed to receive RCOL<0>, so that the postdecoders, sense amplifier and write driver for block 3 are all disabled on column address 17. RCOL<0> is also used in the logic of the first spare read/write block to enable the first spare column and read/write block in place of main block 3.

The delays inherent in the address detector circuit and bad address flag selection logic could result in the re-enabling of the main array being too slow. The delay in disabling the main array is not a problem as long as it still allows full recovery of the local data lines in the required time. The enabling of the spare column is also less critical as the read/write is not hindered by the column pass gate of a normal column. Hence the logic block 122 within the main read/write block receives a periodic clock signal having a fixed characteristic frequency. The periodic signal generally represents an external clock signal that may be used to synchronize the redundancy operation to the incoming address signals. For a non-clocked (asynchronous) memory, a self generated clock such as an address transition detector (ATD) pulse may be used. In general, the clock signal may mirror the address path, with similar logic gates and routing to enhance the tracking and synchronicity of the clock and address signals. The clock may also be used, possibly via a delay element that tracks the differential voltage between the bitlines, to turn on the sense amplifiers i.e., to ensure that a predetermined differential voltage has been developed.

Implementing the repair cycle with the clock allows the advantage of starting a spare column access without waiting for the defective address detector to deactivate the defective address control signal. A more detailed description of the implementation of an external clock presented to the sense amplifier 130 will be discussed in connection with FIG. 7.

FIG. 5 shows a single chip or IC implementation of the present invention comprising eight blocks or sectors ("octants") 100 of memory storage elements. The octants 100 may be used to implement the various bits in, for example, a 16K×8 memory. Naturally, the chip may comprise any number of blocks or sectors, 2 m being preferred (where m≧1, preferably 2≦m≦5). The number of blocks or sectors 100 may thus be chosen to implement a larger or smaller bit-width memory array. Specifically, the particular bit-width of the memory array may be increased or decreased accordingly to meet the design criteria of a particular application.

Each of the circuits 100 generally comprises a plurality of main memory elements and one or more spare memory elements. In a preferred embodiment, the memory element is a column of 2n memory cells, where n≧1, preferably n≧2, more preferably n≧3, and most preferably 3≦n≦6 or 7. The implementation of FIG. 5 has four spare columns 112 and read/write blocks 108 per octant.

Each octant generally implements eight sense amplifier/write drivers 150, 154 in a one-to-one ratio with respect to the input/output (I/O) cell block 102. The I/O cell block 102 may comprise a conventional interface between the circuit of the present invention and other external components. Each read/write circuit (e.g. 106) may be multiplexed into a plurality of individual columns via the corresponding column pass gates (e.g., 116$a$–116$n$ in FIG. 4).

Figure 6:
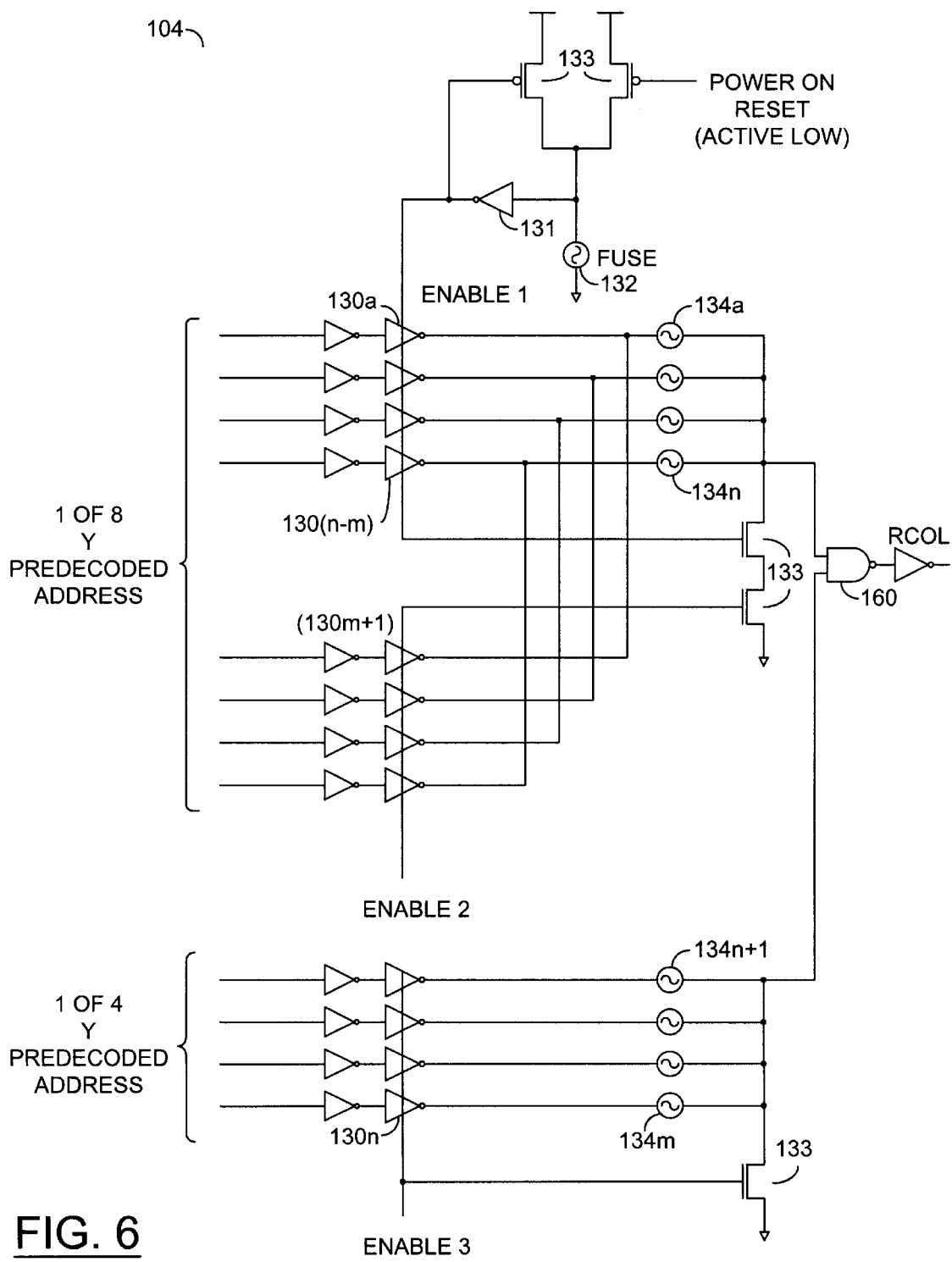
FIG. 6 is a diagram of a defective address detector in accordance with the present invention.

FIG. 6 shows an implementation of a defective address detector 104. In this case, fuses are used as the programmable elements 105 and a 5-bit binary address has been predecoded into a one-of-eight signal (i.e., only one line is active high in a group of eight lines) and a one-of-four signal. Other programmable elements, logic and styles and/or sizes of address bus are possible. Groups of four buffer circuits 130$a$–130$m$ are enabled by blowing a fuse that sets a small latch; if the fuse is not blown the global on-chip power on reset signal clears the latch at power up. The fuse and latch circuit will be described here as a "Fusebox". Two such groups arc paralleled for the one-of-eight address, while a single group is used for the one-of-four. Further fuses disconnect the unwanted buffer outputs. The enable signals are used to control NMOS devices which clamp the buffer outputs when no programming has been performed; otherwise the voltage levels of the outputs would float. The selected one-of-eight and one-of-four are combined in a NAND gate, a similar function to the column postdecoder circuits of the main memory array, and then inverted to provide the bad address flag (spare column control signal) RCOL<n>. A number of fuses 134$a$–134$m$ as well as a number of NMOS clamp transistors 133 are also provided.

The defective address detector 104 generally comprises one buffer 130$a$–130$n$ per Y-address line. To detect a particular address, two of the buffers 130$a$–130$n$ are generally enabled to pass the signal Y1OF (n–m) and the signal Y1OFM to an AND gate 160 to generate a redundant memory control signal (e.g., RCOL<n>). As a result, the signal RCOL<n>may indicate that one of the memory blocks in the octant has a bad column, and should be disabled, and the nth spare column 112 and read/write circuit 108 are activated in its place. The column pass gates may be controlled by they-address signal. Generally, an n-bit y-address may be split into a signal Y1OF [n–m](which may represent an (n–m)-bit control signal corresponding to main memory columns) and a signal Y1OFM (which may represent a M-bit control signal corresponding to spare memory columns), where n>m, preferably where n=am, a being an integer of at least two. In a specific embodiment, n is 8 and m is 4. Generally, only one bit of the (n–m) bits may be activated at a given time. As a result, the column postdecoder may be implemented as a two input NAND gate (to be described in more detail in connection with FIG. 8).

Figure 7:
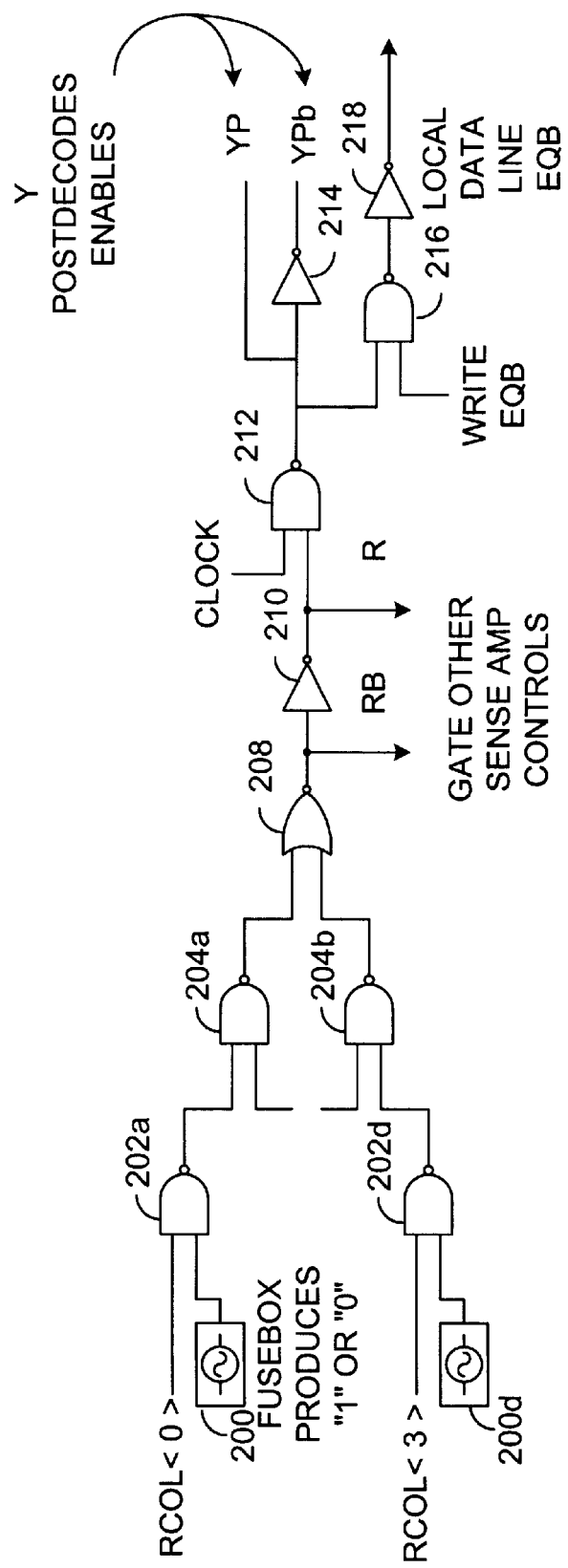
FIG. 7 is diagram of a sense amplifier logic circuit in accordance with the present invention.

FIG. 7 shows an example of the logic circuitry 122 added to the main read/write block logic 106 of FIG. 4. The programmable elements comprise fuses and latches (fuseboxes). The example allows for four spare columns to be shared among the memory blocks (one block per I/O). One or more of the bad address flags RCOL<0:3> are selected as inputs by blowing the appropriate fuse(s) and NANDing the fusebox output with the RCOL. Further NAND and NOR gates implement an OR function of the RCOLs. The RB signal is low, and its inverse R is high, if any one or more of the selected RCOLs is activated. R and RB are used to gate the read/write controls such as the sense amp enable and write pulse. R is combined with the on-chip clock to produce the postdecoder enables YP and its inverse YPB. The postdecoder enable thus follows the timing of FIG. 8. YP is also used to activate the write recovery circuit on the local data line in addition to the write recovery signal WEQB.

The sense amplifier/write driver logic circuit 122 may comprise a programmable defective address element (e.g., fusebox 200), a first AND-type logic element (e.g., NAND gate 202a), a first OR-type logic element (e.g., NOR gate 208), a second AND-type logic element (e.g., gate 212), and a third AND-type logic element (e.g., NAND gate 216). The example of FIG. 7 shows several optimal features, including an inverter 210 (for generating a control signal complementary to the output of NOR gate 208), an inverter 214 (for generating a control signal comp to the output of 212), and inverter 218 (for generating a control signal complementary to 216). In the context of the present invention, an "AND-type logic element" refers to an AND gate, a NAND gate, or an equivalent thereof (e.g., AND is equivalent to NAND plus an inverter) for a generating control signal complementary to the output of 210, and an "OR-type logic element" refers to an OR gate, a NOR gate, or an equivalent thereof. The first AND-type logic element has first and second inputs which may receive signals from the programmable defective memory address element 200 and from the first bit of the redundant memory control signal word (e.g., RCOL<0>).

Where the logic circuit comprises a plurality of AND-type gates 202 output are generally presented to one or more additional AND-type logic gates (e.g., NAND gates 204a–b). The outputs ofthe additional AND-type gates (e.g., 204a and 204b) are generally presented to an OR-type logic element (e.g., NOR gate 208), whose output is generally presented to a third AND-type logic element (e.g., NAND gate 210).

The second AND-type gate 212 also generally receives a periodic signal (e.g., CLOCK) having a characteristic fixed frequency. The periodic signal generally represents an external clock signal that may be used to synchronize the spare columns 142 to the incoming address information/signals. The output of the second AND-type gate, which is generally presented to the third AND-type gate 216 and, when present to the inverter 214, thus has the characteristic frequency of the periodic signal when the redundancy control signal is active. The AND-type gate 216 may also receive third signal (e.g., WRITEEQB). The third AND-type gate 216 may generate an equilibration signal (e.g., EQB) optionally through an inverter 218.

The second AND-type gate 212 may generate an enable signal (e.g., YP). The inverter 214 may generate a complementary signal (e.g., YPB). The enable signal(s) may activate one or more postdecoders 118a–118n.

Each redundancy control signal (RCOL) may be presented to each of the eight main sense amplifiers in the particular octant. Additionally, the redundancy control signal is presented to one of the spare sense amplifiers in the octant. For example, if a particular column, (e.g., column 17) of a particular sense amplifier (e.g., SA3) is defective, the redundancy control signal for the first spare memory element (e.g., RCOL<0>) may be programmed to indicate the particular column address as 17. As a result, the sense amplifier connected to the defective column (SA3) should receive the appropriate redundancy control signal RCOL <0>so that column address 17 is disabled. The first spare sense amplifier (SA0) may be hard wired to the control signal RCOL<0>to be enabled.

Each main read/write block's logic circuit takes in all the RCOL signals (i.e., one per spare element). One or more of the RCOLs are selected using fuseboxes 200a–200n and NAND gates 202a–202n. Further logic gates 204a, 204b and 208 effectively OR the chosen RCOLs, so that if any of them are active the read/write block is disabled. This therefore allows for more than one defective memory element (e.g., column) per block to be repaired. The redundant control signal R and/or its complement RB may gate the remaining sense amplifier/write driver controls (e.g., read enable, write pulse). Similar gating of these signals directly with RCOL may be conducted to enable the spare read/write block.

The column pass gates for the defective column(s) may be disabled by an active enable signal (e.g., YP and/or YPB), which are generally derived from the third AND-type gate and a periodic signal (e.g., CLK). The periodic signal may be an on-chip clock that may mirror the longest address input path, and/or control dynamic bit line equalization, via a delay stage that tracks the differential voltage between the bitlines coupled to a particular memory cell. The corresponding sense amplifier may turn on when a predetermined differential voltage has been developed.

Figure 8:
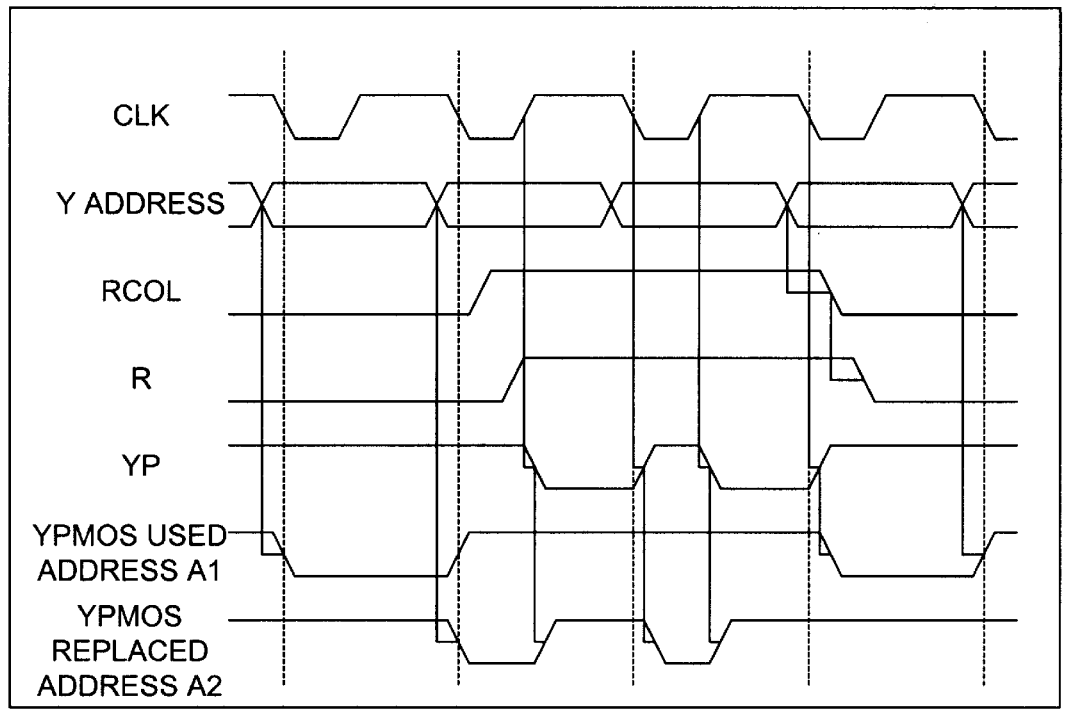
FIG. 8 is a timing diagram illustrating waveforms for various signals in accordance with the present invention.

Referring to the example timing diagram of FIG. 8, the periodic clock signal CLK generally comprises a controlled width low (in this case) pulse which determines the time that the bitlines are free for a read or write, respectively driven by the memory cell or the write driver. The remainder of the period, as set by the external signals (clock or address changes), generally defines the time when the bitlines and the local data lines are recovered and/or equalized to their steady state values. As a result, the falling edge of the signal CLK generally indicates the start of a particular cycle and may be used to re-enable the column pass gates, irrespective of the particular state of the redundant memory signals RCOL<n>. When the signal CLK transitions high again, the signal RCOL<n> then generally determines whether the post decoders are disabled or not, and whether the local data line should be equalized. As a result, the defective address decoder may take an amount of time up the low period of the signal CLK to transistor from one particular state to another while introducing little effect on the operation of the memory circuit 100. The spare read/write block timing comes directly from the bad address flag.

Address A1 corresponds to a good column, and address A2 to a bad column that must be replaced. When address A2 arrives, the previously programmed nth defective address decode block produces the signal RCOL<n> with some delay. RCOL <n> is then fed to all the main read/write block logic circuits, one of which will have been programmed to accept it. The logic then produces the signal R with a delay. To eliminate the effect of the delays, R is gated with CLK to produce YP, which therefore has a fixed, definite timing. YP is used to disable all the column postdecoders for the read/write block, and to simultaneously recover the local data lines to eliminate any residual charge on them due to the faulty column. RCOL<n> is also fed to the nth spare memory element to enable it.

Figure 9:
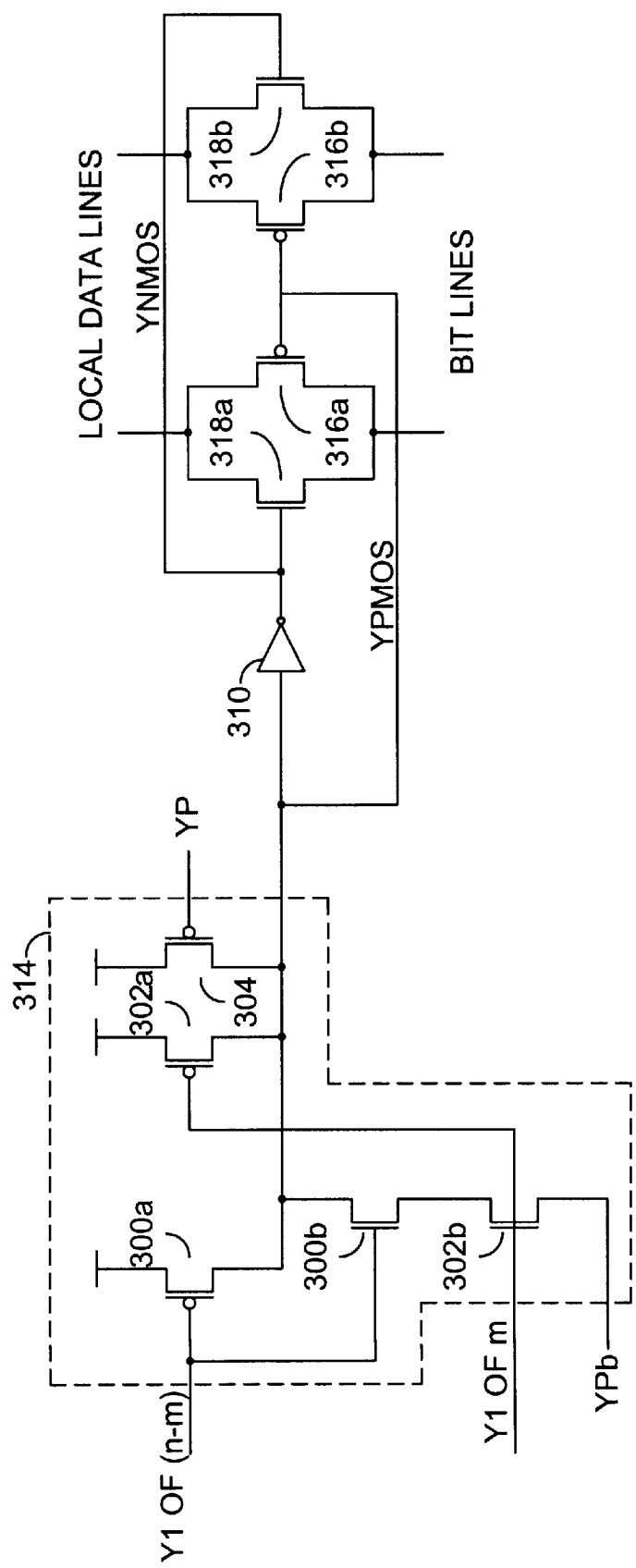
FIG. 9 is a circuit diagram of exemplary postdecoder and pass gate circuits useful in the present invention.

FIG. 9 shows an implementation of the column postdecoder and pass gates. The postdecoder circuit 314 is essentially a three input NAND gate, taking a one-of-eight and a one-of-four column address (similar to the bad address detector logic) and the enable signal YP. In order to fit into the column layout pitch in this instance, the enabled two input NAND approach was used, requiring YP and its inverse YPB as enable signals. The resulting signal YPMOS is used to control the P-channel devices of the CMOS transmission gates, one per bitline. YPMOS is inverted to obtain YNMOS which controls the N-channel pass gate devices.

FIG. 9 shows a circuit diagram of an exemplary postdecoder (e.g., one of 140n in FIG. 4). The postdecoder generally comprises a first CMOS driver (e.g., a PMOS transistor 300 and a NMOS transistor 300b), a second CMOS driver (e.g., a PMOS transistor 302 and an NMOS transistor 302b), a pullup transistor 304, an optional inverter 310, and at least one pass gate (i.e., PMOS transistors 316a and 316b and NMOS transistors 318a and 318b). The pass gates may be implemented as CMOS pass gates, MOS pass gates or other type gates that provide a similar finction. While the present invention has been described in connection with a 3 input NAND gate having a particular configuration, other gates having a similar function may be substituted accordingly to meet the design criteria of a particular application.

The main memory address signal (e.g., Y1OF(n–m)) is generally presented to the gates of one CMOS driver. The signal YIOFM is generally presented to the gates of the remaining CMOS driver. The postdecoder signal and/or its complement may be received at a source/drain terminal of one or both of the PMOS or NMOS transistors of the drivers.

The output of the pull down driver(s) may comprise a pull down pass gate activating signal (e.g., PMOS and/or NMOS), which couples the local data bus lines to the bit lines of the corresponding column. Thus, the active voltage (s) on one of the local data lines and the bit lines may precharge and/or equalize the voltage(s) on the other. The signals YP and YPB are generally presented to each of the 32 column postdecoders in the particular sense amplifier block. As result, one may substitute a two-gate driver structure for a typical three input NAND gate, reducing chip consumption. The NAND gate 314 shows one such implementation. Additional signals may be added with the addition of another transistor 302 at the drain of the transistor 302b.

Figure 10:
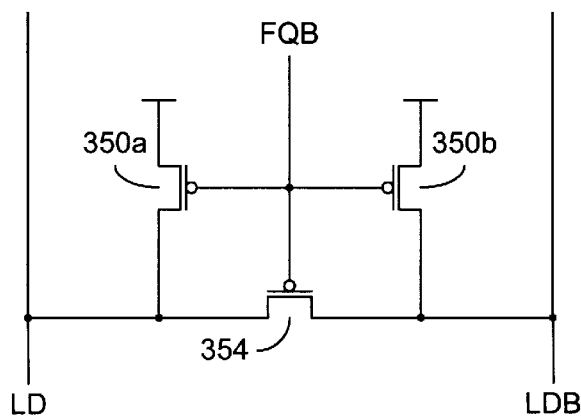
FIG. 10 is a diagram illustrating an exemplary write equalization circuit useful in the present invention.

FIG. 10 illustrates an example local data line and/or write recovery circuit. A PMOS device 350a is connected between LD and VCC, and a second 350b between LDB and VCC, LD and LDB being the local data lines. A third PMOS 354 connects between LD and LDB. All three devices have their gates connected to a recovery signal EQB. When the signal EQB is activated (i.e. taken low), PMOS 354 shorts the local data lines together (equalization) and devices 350a and 350b pull the lines up to VCC (recovery). The circuit could optionally contain only devices 350a and 350b, or device 354; in the latter case the pull-up function may be provided by static local data line or bitline loads.

Figure 11:
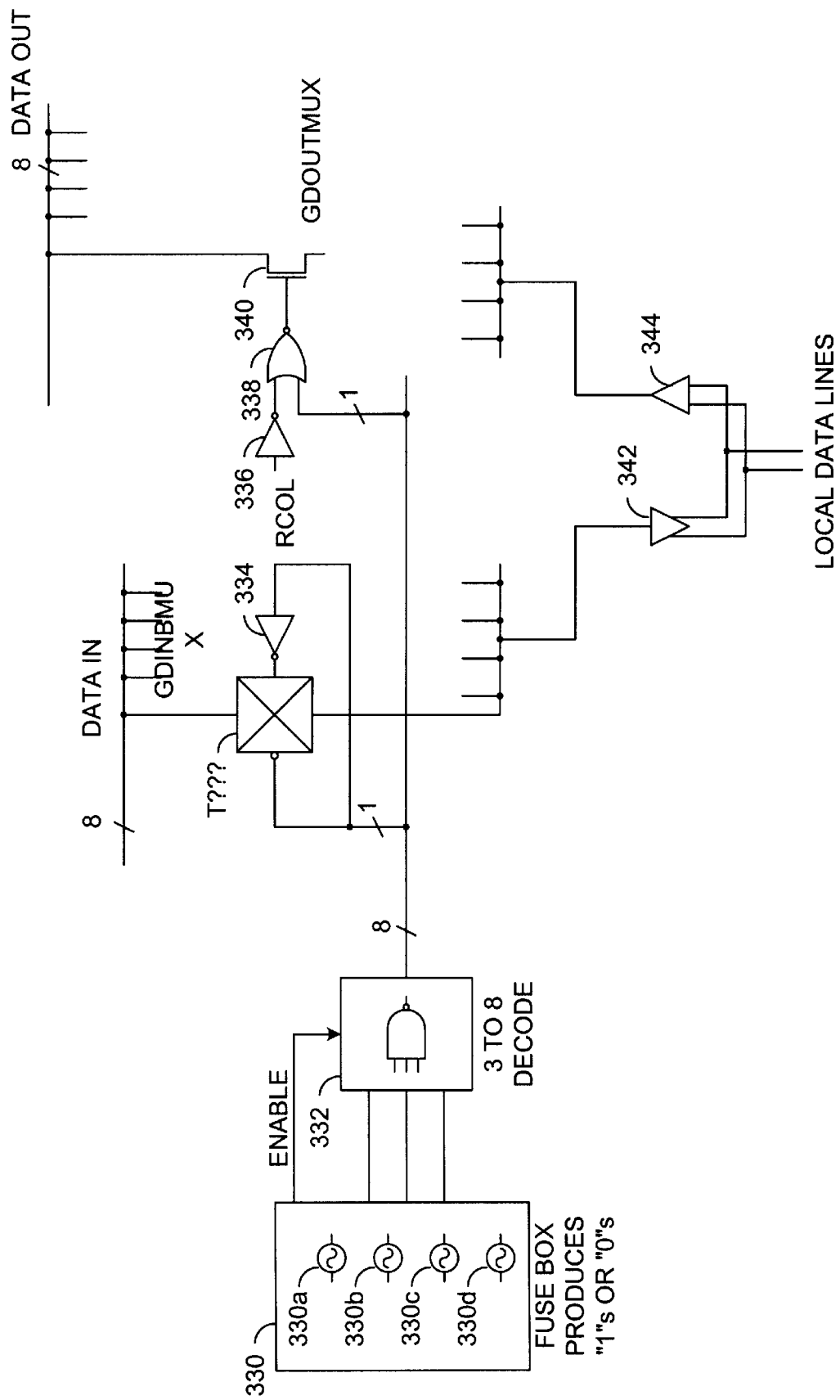
FIG. 11 is a diagram illustrating multiplexers connecting a spare sense amplifier to global data lines in accordance with the present invention.

FIG. 11 shows an example multiplexer used to connect a spare read/write block to the appropriate global data bus lines. Fuses and latches are used as programmable elements—one fuse indicates that the spare column and read/write block may be used while further fuses indicate the I/O cell that the multiplexer must connect to. In this example there are eight I/Os and so three fuses and a three-to-eight decoding scheme are used. Separate lines are used for input and output per I/O. The data input from I/O to write driver has full logic swings and so the multiplexer is composed of full CMOS transmission gates. The data may be passed whether the spare read/write block is enabled or not. The data output from sense amplifier to I/O cell has a reduced logic swing and an NMOS pass gate is sufficient. However, data is generally only passed when the read/write block is activated to avoid contention on the bus. Hence, the control signal for each pass device is gated with the RCOL signal.

The output multiplexer, generally comprises the OR-type gate 338 and the switch 340, may receive the redundant memory control signal (e.g., RCOL<0>). The spare sense amplifier SA0 generally drives the output line during a spare memory read operation. The multiplexer may use an NMOS cascade of pass gates when the spare sense amplifier SA has an NMOS pullup (typically characterized by (a limited high swing). As a result, the input de-multiplexer may permanently connect the global data input signal (e.g., GDINB<3>) to the spare sense amplifier. Alternatively, full CMOS transmission or pass gates (such as 316a–310a in FIG. 9) may be implemented to accommodate input data that may have a full logic swing.

While the invention has been particularly shown and described with reference to the preferred embodiments thereof, it will be understood by those skilled in the art that various changes in form and details may be made without departing from the spirit and scope of the invention.

I claim:

1. A circuit comprising:

two or more main memory elements;

a first sense amplifier and write driver configured to present information from and to said main memory elements;

a spare memory element;

a second sense amplifier and write driver configured to present information from and to said spare memory element on a pair of differential data lines; and a logic circuit configured to (a) enable said second sense amplifier and (b) decouple at least one main memory element from said first sense amplifier in response to an address of a defective main memory element; and an equalization circuit configured to equalize said pair of differential data lines only after a write operation.

2. The circuit according to claim 1 further comprising a postdecoder and a pass gate, each coupled to one of said main memory elements.

3. The circuit according to claim 1 wherein said main memory elements and said spare memory element each comprise a column.

4. The circuit according to claim 3 further comprising:

a spare sense amplifier logic circuit configured to receive a control signal and enable one or more of said spare memory cells in response thereto.

5. The circuit according to claim 3 further comprising one or more local data busses configured to couple said first sense amplifier to said two or more columns.

6. The circuit according to claim 1 further comprising a programmable storage element for storing said address of said defective main memory.

7. The circuit according to claim 1 wherein each of said spare columns further comprises a clock input for reducing delays.

8. The circuit according to claim 7 wherein each of said logic circuits further comprises a clock input for reducing delays.

9. A method for repairing defective memory elements in a memory array, comprising the steps of:

determining whether an address corresponds to a defective memory element;

enabling a spare memory element and a spare sense amplifier/write driver on a pair of differential data lines;

decoupling said defective memory element from a main sense amplifier/write driver configured to connect to said defective memory element; and equalizing said pair of differential data lines only after a write operation.

10. A circuit comprising:

two or more main memory elements;

first means for presenting information from and to said main memory elements;

a spare memory element;

second means for presenting information from and to said spare memory element on a pair of differential data lines;

means for (a) enabling said second sense amplifier and (b) decoupling at least one main memory element from said first sense amplifier in response to an address of a defective main memory element stored in a reprogrammable element; and means for equalizing said pair of differential data lines only after a write operation.

* * * * *